United States Patent [19]

Zoroglu

[11] 3,719,535

[45] March 6, 1973

[54] HYPERFINE GEOMETRY DEVICES AND METHOD FOR THEIR FABRICATION

[75] Inventor: Demir S. Zoroglu, Scottsdale, Ariz.

[73] Assignee: Motorola, Inc., Franklin Park, Ill.

[22] Filed: Dec. 21, 1970

[21] Appl. No.: 100,154

[52] U.S. Cl. ....................................148/187, 29/578

[51] Int. Cl. ..............................................H01l 7/44

[58] Field of Search ........148/187, 186, 188; 29/576, 29/578, 571; 317/234, 235; 117/201, 212

[56] References Cited

UNITED STATES PATENTS

| | | | |
|---|---|---|---|
| 3,342,650 | 9/1967 | Seki et al. | 148/187 |
| 3,560,278 | 2/1971 | Sanera | 148/187 |
| 3,203,840 | 8/1965 | Harris | 148/187 |
| 3,275,910 | 9/1966 | Phillips | 317/235 |
| 3,309,245 | 3/1967 | Haenichen | 148/187 |
| 3,372,067 | 3/1968 | Schaefer | 148/187 |
| 3,460,007 | 8/1969 | Scott, Jr. | 317/235 |

*Primary Examiner*—Anthony Skapars
*Attorney*—Mueller & Aichele

[57] ABSTRACT

A hyperfine geometry device and the method for the making thereof is disclosed which method employs the combination of a patterned oxide layer having apertures designating all the regions to be diffused into a substrate body. A layer of amorphous silicon is formed over the upper surface of the substrate body including the surface of the substrate exposed through the apertures as well as the oxide formed on said upper surface. A third layer of silicon dioxide is formed over the amorphous silicon layer and is patterned to expose selected apertures within the initial or first oxide layer. The patterning of this third layer need not be precise. A diffusion is performed through such exposed amorphous silicon areas into the substrate body. After such diffusion, the amorphous silicon is chemically changed into an oxide for protecting the diffusion aperture from additional diffusions or alternatively, a new passivating layer is formed over such previously diffused areas. In this manner apertures in the first oxide layer are selectively exposed as required in the sequence for manufacturing the desired semiconductor device.

8 Claims, 11 Drawing Figures

INVENTOR.

Demir S. Zoroglu

BY Mueller & Aichele

ATTY'S.

HYPERFINE GEOMETRY DEVICES AND METHOD FOR THEIR FABRICATION

BACKGROUND OF THE INVENTION

In the manufacture of semiconductor devices, often times it is required that a latter diffusion be precisely aligned with an earlier diffused region. It is a well known fact that semiconductor devices have uniform and predetermined characteristics, when amongst other things, certain of their regions formed by a diffusion geometrically aligned with other regions formed by diffusion. For example, in a high frequency interdigitated transistor, it is important that the emitter regions be precisely aligned with the previously formed base regions. Another example relates to the placement of a channel region of a junction field effect transistor wherein the gate region is precisely centered between source and drain regions.

Sequential use of individual masks over the semiconductor body is the acceptable method taught by the prior art for forming these precisely aligned regions. For example, a first mask having a plurality of base apertures is formed over a substrate body in which a plurality of transistor devices are to be formed. Each of the base regions is formed by a single diffusion and passivating oxide is formed thereover. A next sequential mask is aligned with the just previous mask for placing the emitter region within the base region. In many instances, the base region is an interdigitated region and likewise the emitter region is an interdigitated region which must be precisely aligned with or centered in the previously diffused or previously formed base region. Whenever the emitter region extends outside of the previously formed base diffusion region the device fails to operate in its desired characteristic form.

The alignment problem is a visual problem on the part of the operator attaching the second sequential mask to the substrate body. It has been found that in hyperfine geometry (with 0.1 mil or less spacing) devices these visual adjustments give errors on the order of up to 50 percent in positioning the second region with reference to the first region.

An improvement over this prior art method is disclosed by Michael K. Dickman in his application entitled "Method of Producing a Semiconductor" filed July 10, 1970, Ser. No. 53,813, now abandoned, and assigned to the assignee of the present invention, case P–70230.

SUMMARY OF THE INVENTION

This invention relates to hyperfine geometry devices and the method for manufacturing the same, and more particularly, it relates to the use of a multilayer mask which includes as its intermediate layer a body of amorphous or polycrystalline silicon.

It is an object of the present invention to provide a new method for forming hyperfine geometry devices.

It is another object of the present invention to provide a new method for manufacturing hyperfine geometry devices wherein a multilayer mask is employed.

A still further object of the present invention is to provide a multilayer mask for forming semiconductor devices wherein a first mask has formed therein, during one operation, all the apertures associated with regions to be formed in the semiconductor body, and a second layer of amorphous silicon is formed over the first mask.

A still further object of the present invention is to provide a first mask having a plurality of apertures formed therein, a second layer of polycrystalline silicon covering all of said apertures and then selectively exposing each of the apertures in said first mask for forming diffused regions in said semiconductor body and then forming a passivating layer over each said diffused region after the required semiconductor region has been formed in the semiconductor body.

Yet another object of the present invention is to provide a method for converting the polycrystalline or amorphous silicon over a diffused region into silicon dioxide.

Another object of the present invention is to provide an upper passivating layer of silicon dioxide for protecting the diffused regions already formed in a semiconductor body.

These and other objects and features of this invention will become fully apparent in the following description of the accompanying drawings, wherein:

FIG. 1 shows the semiconductor body having an initial layer of oxide formed thereover;

FIG. 2 shows an opening of an initial aperture window in said oxide layer shown in FIG. 1;

FIG. 3 shows a base predeposition;

FIG. 4 shows the reoxidization over this predeposition step;

FIG. 5 shows the opening of all of the apertures in the oxide layer of FIG. 4 which are required for the fabrication of the semiconductor device;

FIG. 6 shows the forming of the polycrystalline layer and a second silicon dioxide layer;

FIG. 7 shows the gross patterning of the upper silicon dioxide layer for exposing the polycrystalline silicon through which regions are formed in the semiconductor body;

FIG. 8 shows the passivation of that portion of the polycrystalline silicon through which the last diffusion step has been performed;

FIG. 9 shows the removal of the remaining upper oxide mask layer with the subsequent formation of an emitter region;

FIG. 10 shows the final semiconductor device with metal electrodes fabricated according to the teachings of the present invention.

BRIEF DESCRIPTION OF THE INVENTION

The present invention contemplates the use of a multilayer mask for fabricating fine line geometry semiconductor devices. A first mask is formed over the upper surface of a body of semiconductor material into which a plurality of semiconductor devices are to be fabricated. A plurality of apertures are formed in a first mask such as to open all apertures to be employed in making the semiconductor devices desired. A layer of polycrystalline, amorphous silicon is formed over the remaining oxide layer as well as the exposed upper surface of the semiconductor body. A third passivation layer is formed over the last mentioned polycrystalline silicon layer and is patterned to selectively expose certain of the apertures formed in the first mask. A diffusion or diffusions takes place through such opening in the upper oxide mask and through the polycrystalline silicon layer into the exposed surface of the semiconductor body. Next, the polycrystalline silicon layer is converted to silicon dioxide or alternatively a fresh passivating layer is formed over the entire surface of a composite structure. Next, through one or more passivating layers, additional apertures are exposed for later diffusions. The exposing and diffusing through apertures in the first passivating layer can continue until all desired diffusions have been made into the semiconductor body. In order to complete the device, the appropriate preohmic apertures are formed and the required metallization is formed over the surface of the semiconductor device.

DETAILED DESCRIPTION OF THE INVENTION

Figure 1:
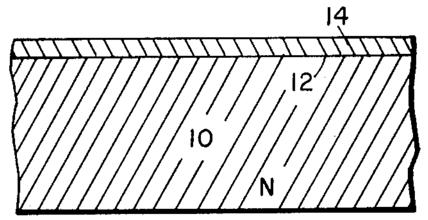
FIGS. 1 through 10 show the various process steps and the final product made according to the teaching of the present invention.

Referring to FIG. 1 there can be seen a semiconductor body 10 having an upper surface 12 and a passivating layer 14 formed over such upper surface 12. The semiconductor body 10 is shown as N-type silicon. However the present invention can be employed equally as well with compound semiconductor substances selected from groups III and V, II and VI of the periodic table such as GaAs, CdS, etc. Additionally, the semiconductor body can equally be of P-type semiconductor material. The oxide layer 14 is shown as silicon dioxide but other well known passivating layers can be used in this and substitutes therefore. Such substitutes include silicon nitride and aluminum oxide.

Figure 2:
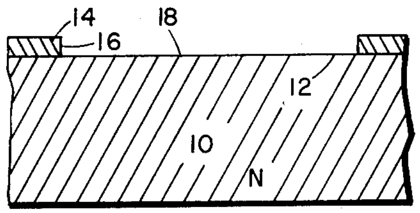

Referring to FIG. 2 there is shown the formation of an aperture 16 in the oxide layer 14. The aperture 16 exposes a portion 18 of the upper surface 12 of the semiconductor body 10. The diffusion to be performed through the aperture 16 is not one that requires precise alignment but rather is a preparation step prior to a diffusion which precedes those requiring precise alignment.

Figure 3:
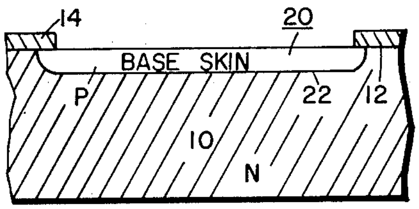

Referring to FIG. 3 there is shown the P-type diffusion region 20 formed by diffusing a conductivity type determining impurity such as boron into the semiconductor body 10. The P-type region 20 forms a PN junction 22 with the N-type semiconductor body 10. The junction 22 intersects the upper surface 12 under the oxide layer 14.

Figure 4:
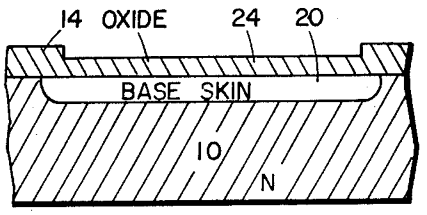

Referring to FIG. 4 there is shown the additional oxide layer 24 which is formed during the diffusion step of the region 20. During the formation of the oxide layer 24 the original oxide layer 14 is increased a proportional amount of its original depth.

Figure 5:
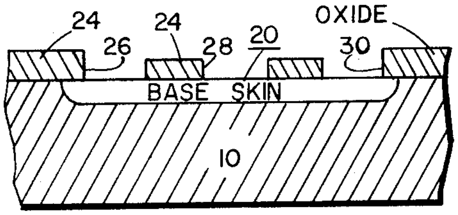
Figure 10:
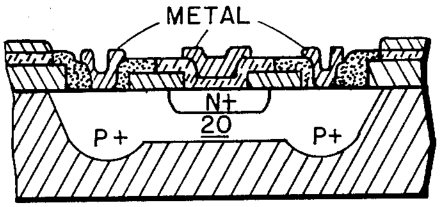

Referring to FIG. 5 there is shown the patterning of the oxide layer 24. All the openings required to be made in the oxide layer 24 are made at this time. These include apertures 26, 28 and 30. It should be borne in mind that only one transistor region is shown. Normally, in the production of integrated circuits, a wafer is employed on which vast numbers of individual semiconductor devices are formed. During the particular step presently being described that of opening all the apertures within the lower oxide layer 24, it is intended that such oxide layer extends across and includes a plurality of other semiconductor devices. Accordingly, all the regions required to be formed in a semiconductor body are aligned during one photoresist masking step wherein all apertures are formed in one step. The formation of the apertures shown with reference to FIG. 5 are made through the use of a standard photoresist mask technique whereby a layer of photoresist material is formed over the entire upper surface of the composite structure. The photoresist material covering the oxide portions which are to remain on the upper surface 18 of semiconductor body 10 are exposed and developed according to well known techniques with the remaining photoresist being subsequently washed off.

Next the composite device is immersed in a HF bath which is employed for removing silicon dioxide such as portions of the layer 24 removed in forming apertures 26, 28 and 30. The photoresist material remaining on the surface is removed by a solvent designed for that purpose.

Figure 6:
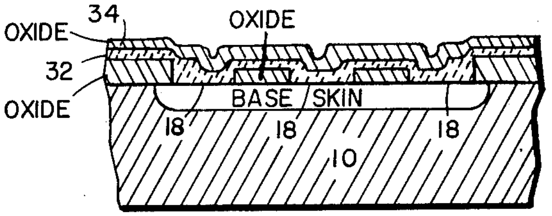

Referring to FIG. 6 there is shown the formation of the second and third layers of the multilayer mask employed in the present invention. A layer 32 of amorphous-polycrystalline silicon is formed over the remaining portions of the oxide layer 14 and adheres to exposed surface portions 18 of the semiconductor body 10. The initial oxide layer 14 has been formed to have a thickness lying within the range 1,000 – 1,500 angstroms. If a high concentration diffusion is to be made into the semiconductor body 10 a thicker initial oxide layer 14 is used. The amorphous-polycrystalline silicon layer 32 has a similar thickness, that is lying within the range of 1,000 – 1,500 angstroms. Using an amorphous-polycrystalline silicon layer 32 having a greater thickness causes problems in the type of diffusion and the patterning of the aligned region. A final passivating layer 34 is formed over the amorphous-polycrystalline silicon layer 32. The layer 34 is again selected as silicon dioxide although other suitable passivating layers are available. The final oxide layer 34 is formed having a thickness lying within the range of 1,000 – 1,500 angstroms.

Figure 7:
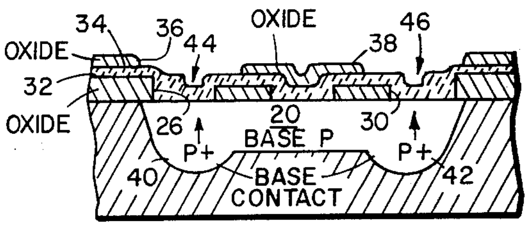

Referring to FIG. 7 there is shown how the upper oxide layer 34 is patterned to form a plurality of apertures 36 and 38. The device presently being made according to techniques of the present invention is a bipolar transistor. The base of such bipolar transistor has been formed during the predeposition step as shown in FIG. 3. The patterning of the upper oxide layer 34 as shown in FIG. 7 has prepared the structure shown in FIG. 6 for the formation of the base contact enhancement regions 40 and 42 shown with reference to FIG. 7. Conductivity type determining impurities such as boron are passed through the exposed amorphous-polycrystalline silicon areas indicated at 44 and 46. In this manner, the conductivity type determining impurities pass through the amorphous-polycrystalline silicon layers and form the base contact enhancement regions 40 and 42. During this diffusion step the original base region 20 has out-diffused an additional distance as indicated in the figure.

Figure 8:
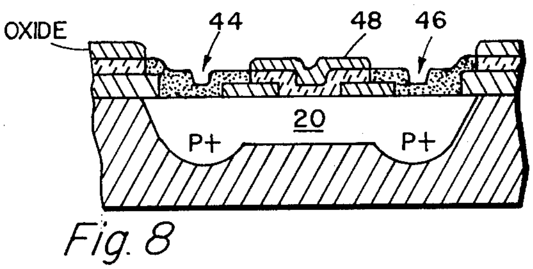

Referring to FIG. 8 there is shown how the exposed portions 44 and 46 of the amorphous-polycrystalline silicon layer 32 are converted to silicon dioxide by exposing the structure as shown in FIG. 7 to steam, for example, at 1,000° C.

Figure 11:
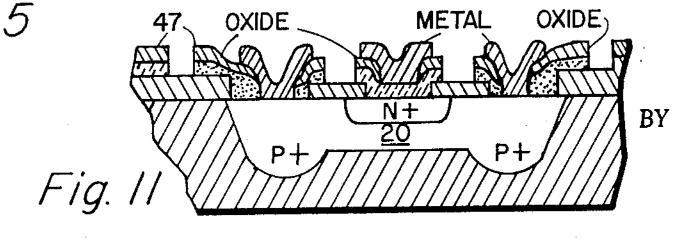
FIG. 11 shows the substitution of a third layer of silicon dioxide on the amorphous silicon as a means of passivating said amorphous silicon for the step of changing the amorphous silicon to silicon dioxide.

In those situations in which the exposure to steam at 1,000° C. might adversely move around the diffused regions within the semiconductor body 10, an alternative approach is available whereby an additional passivating layer 47 is formed over the entire structure as shown with reference to FIG. 11. In this manner, subsequent patterning of the upper passivating layer during later diffusion steps includes the removal of a thicker passivating layer as the layer 34 is increased in thickness with each additional thickness of added silicon dioxide 47. More specifically, the upper oxide layer 34 is effectively increased in thickness by the addition of such additional passivating layers. However, for the purpose of this description, the device shown with reference to FIG. 8 does not require an additional oxide layer formed thereover since the polycrystalline material has been charged to silicon dioxide by the steam process.

Figure 9:
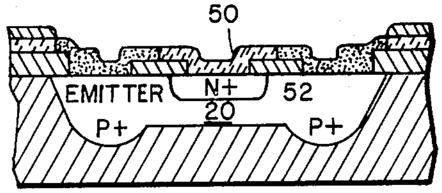

Referring to FIG. 9 the remaining oxide area indicated in FIG. 8 at 48 is removed. Accordingly a diffusion over the entire surface penetrates only the polycrystalline silicon indicated generally in the area at 50. An N+ emitter region 52 is formed during this last mentioned diffusion operation. The function of the multilayer mask technique is to symmetrically locate the emitter region 52 within the base region comprising original portions 20 plus the base contact regions 40 and 42.

The formation of the apertures 26, 28 and 30 are formed by a single mask. Accordingly, the relative positioning of any one of such apertures such as 28, to any other apertures, such as 26 and 30 is determined by this initial mask, and hence, no misalignment is possible. Although a bipolar transistor is shown with reference to FIGS. 1 through 10 it is only shown as a matter of an example of the use of the multilayer mask element of the present invention. A MOS device can equally as well be formed by the exact same apertures in the initial oxide layer 24. For example, the apertures 26 and 28 can be employed for forming source and drain regions of a junction field effect transistor and the aperture 28 can be used to form the upper channel region of such a device. As is well known, the lower channel portion is formed prior to the formation of the upper channel and the source and drain regions. The need for critical alignment exists between the upper channel formed through the aperture 28 and the source and drain regions formed through the apertures 26 and 30.

In its broadest use the present invention can be employed for aligning a later diffused region within an earlier diffused region or regions by means of a multilayer mask technique wherein the initial oxide layer has formed therein all the apertures required in the formation of the semiconductor device by a plurality of diffusion steps. After the formation of such a lower mask layer, a layer of amorphous-polycrystalline silicon is formed over the remaining oxide layer and the exposed surface of the semiconductor body followed by the formation of an upper passivating layer. The upper passivating layer is the device which will be patterned more than once. The patterning of the upper layer need not have the extreme accuracy as required in the alignment of the diffused regions. The misalignment of the patterning in the final layer need only be such that the apertures formed in the upper layer are such as to overlie the apertures in the lower mask layer as separated by the amorphous-polycrystalline silicon layer. The diffusions can be performed through the amorphous-polycrystalline silicon layer and hence their placement is controlled by the aperture in the lower oxide layer of the mask. Any misalignment of the apertures in the upper mark are protected against by the remaining portions of the lower oxide layer. The apertures 36 and 38 as shown with reference to FIG. 7 need not be precisely aligned with the apertures 26 and 30 respectively. Rather, a significant degree of misalignment is possible.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for producing a semiconductor device having a plurality of critically aligned diffused regions by a sequence of steps and the use of materials for minimizing the number of steps required, comprising the steps of:

providing a semiconductor body of a first type of conductivity and having an upper surface;

forming a first passivating layer of the type operating to act as a diffusion barrier on said upper surface;

forming a plurality of apertures in said passivating layer which are aligned each to the other;

forming a second passivating layer of the type through which conductivity type determining impurities pass over said first layer and said exposed surface of said semiconductor body;

forming a third passivating layer of the type operating to act as a diffusion barrier over said second layer;

patterning said third layer such as to form at least one aperture overlying a selected aperture in said first layer;

diffusing a conductivity type determining impurity through said aperture in said third layer and through said second layer and through said selected aperture in said first layer into said upper surface of said semiconductor body for forming a diffused region within said semiconductor body;

forming a passivating layer overlying said diffused region for providing a barrier for a subsequent diffusion;

opening at least an additional aperture in said third layer overlying an additional selected aperture in said first layer; and diffusing a conductivity type determining impurity through said last mentioned aperture and through said second layer and through said aperture in said first layer for forming an additional diffused region in said semiconductor body.

2. The method as recited in claim 1, wherein said second layer comprises amorphous-polycrystalline silicon.

3. The method as recited in claim 2, wherein said step of forming a passivating region overlying said diffused regions comprises;

converting said amorphous-polycrystalline silicon to silicon dioxide.

4. The method as recited in claim 2, wherein said amorphous-polycrystalline silicon layer has a thickness lying within the range of 1,000 to 1,500 angstroms.

5. The method as recited in claim 2, wherein said first and third layer each has a thickness lying within the range of 1,000 angstroms to 1,500 angstroms.

6. A method for producing a semiconductor device having a plurality of critically aligned diffused region by a sequence of steps and through the use of materials for minimizing the number of steps required, comprising the steps of:

providing a semiconductor body of a first type of conductivity and having an upper surface;

forming a first passivating layer of the type operating to act as a diffusion barrier on said upper surface;

forming a plurality of apertures in said passivating layer which are aligned each to the other for exposing an equal plurality of surface regions of said body in which diffused regions are to be formed;

forming an amorphous-polycrystalline silicon layer over said first layer and said exposed surface of said semiconductor body;

forming a silicon nitride passivating layer over said amorphous polycrystalline layer;

patterning said silicon nitride layer such as to form at least one aperture overlying a selected aperture in said first layer and exposing a portion of said amorphous-polycrystalline layer, and said aperture in said silicon nitride layer being larger than the aperture it overlies in said first layer for avoiding critical alignment of one aperture to the other;

diffusing a conductivity type determining impurity through said aperture in said third layer and through said second layer and through said selected aperture in said first layer into said upper surface of said semiconductor body for forming a diffused region within said semiconductor body;

converting said exposed portion of said amorphous-polycrystalline silicon to silicon dioxide;

removing the remaining portions of said third layer; and diffusing a conductivity type determining impurity through at least one remaining portion of amorphous-polycrystalline silicon and through at least one aperture in said first layer for forming an additional diffused region in said semiconductor body.

7. The method as recited in claim 6, wherein said first passivating layer is silicon dioxide.

8. The method as recited in claim 6 and further including the step of:

forming an ohmic contact directly upon said last mentioned portion of said amorphous-polycrystalline silicon.

* * * * *